United States Patent
Cho et al.

(10) Patent No.: US 11,170,136 B2
(45) Date of Patent: Nov. 9, 2021

(54) METHOD AND SYSTEM FOR DESIGNING BUILDING MODEL BY USING VALUATION, AND NONTRANSITORY COMPUTER-READABLE RECORDING MEDIUM

(71) Applicant: SPACEWALK, INC., Seoul (KR)

(72) Inventors: Sung Hyeon Cho, Seoul (KR); Jong Min Hahm, Seoul (KR)

(73) Assignee: SPACEWALK, INC., Seoul (KR)

( * ) Notice: Subject to any disclaimer, the term of this patent is extended or adjusted under 35 U.S.C. 154(b) by 326 days.

(21) Appl. No.: 16/245,543

(22) Filed: Jan. 11, 2019

(65) Prior Publication Data

US 2019/0188339 A1    Jun. 20, 2019

Related U.S. Application Data

(63) Continuation of application No. PCT/KR2017/007668, filed on Jul. 17, 2017.

(30) Foreign Application Priority Data

Feb. 24, 2017    (KR) .......................... 10-2017-0025095

(51) Int. Cl.
   *G06F 30/13*    (2020.01)
   *G06Q 10/06*    (2012.01)
   *G06Q 50/08*    (2012.01)

(52) U.S. Cl.
   CPC ......... *G06F 30/13* (2020.01); *G06Q 10/0637* (2013.01); *G06Q 10/06313* (2013.01); *G06Q 10/06315* (2013.01); *G06Q 50/08* (2013.01)

(58) Field of Classification Search
   CPC .............. G06F 30/13; G06Q 10/06313; G06Q 10/06315; G06Q 10/0637; G06Q 50/08

(Continued)

(56) References Cited

U.S. PATENT DOCUMENTS

| | | | | |
|---|---|---|---|---|
| 2012/0078685 | A1* | 3/2012 | Krebs .................. | G06Q 10/063 705/7.37 |
| 2014/0278280 | A1* | 9/2014 | Pardo-Fernandez .... | G06F 30/13 703/1 |

(Continued)

FOREIGN PATENT DOCUMENTS

| | | |
|---|---|---|
| JP | 2003041649 A | 2/2003 |
| JP | 2003150655 A | 5/2003 |

(Continued)

OTHER PUBLICATIONS

International Search Report for PCT/KR2017/007668 of Nov. 10, 2017.

*Primary Examiner* — Kamini S Shah
*Assistant Examiner* — Faraj Ayoub
(74) *Attorney, Agent, or Firm* — Dinsmore & Shohl LLP; Yongsok Choi, Esq.

(57) ABSTRACT

The present invention relates to a method, system, and non-transitory computer-readable recording medium for designing a building model by using valuation. According to one aspect of the invention, there is provided a method for designing a building model by using valuation, comprising the steps of: acquiring information on construction elements and information on financial elements regarding a building site; and hierarchically generating design models for at least one item of a building outline shape that is placeable on the building site, a building core structure that is applicable to the building outline shape, an area distribution according to a purpose of use in the building core structure, and a planar structure of each floor of the building according to the area distribution, on the basis of the acquired information.

9 Claims, 4 Drawing Sheets

(58) Field of Classification Search
USPC .............................................................. 703/1
See application file for complete search history.

(56) References Cited

U.S. PATENT DOCUMENTS

| | | | | |
|---|---|---|---|---|
| 2014/0288890 A1* | 9/2014 | Khainson | ................ | G06F 30/13 |
| | | | | 703/1 |
| 2016/0292750 A1* | 10/2016 | Ritter | ................. | G06Q 30/0278 |
| 2018/0025452 A1* | 1/2018 | Fadeev | ................ | G06Q 50/165 |
| | | | | 705/315 |

FOREIGN PATENT DOCUMENTS

| KR | 20020014582 A | 2/2002 |
|---|---|---|
| KR | 101227741 B1 | 1/2013 |
| KR | 20130142212 A | 12/2013 |

* cited by examiner

METHOD AND SYSTEM FOR DESIGNING BUILDING MODEL BY USING VALUATION, AND NONTRANSITORY COMPUTER-READABLE RECORDING MEDIUM

CROSS-REFERENCE TO RELATED APPLICATIONS

This application is a continuation application of Patent Cooperation Treaty (PCT) international application Serial No. PCT/KR2017/007668, filed on Jul. 17, 2017, which claims priority to Korean Patent Application Serial No. 10-2017-0025095, filed on Feb. 24, 2017. The entire contents of PCT international application Serial No. PCT/KR2017/007668 and Korean Patent Application Serial No. 10-2017-0025095 are hereby incorporated by reference.

FIELD OF THE INVENTION

The present invention relates to a method, system, and non-transitory computer-readable recording medium for designing a building model by using valuation.

BACKGROUND

In order to construct a building, it is necessary to fully consider various conditions including surrounding environment and legal information. Further, the shape of the building may be modeled in various ways depending on the degree or manner of consideration of such conditions.

As one example of conventional techniques, there has been introduced a technique of associating construction plan data with legal data to generate project data, modeling a building site using the generated project data, generating a housing layout plan on the modeled building site, and deriving an optimum layout plan through environmental factor analysis of the generated layout plan.

However, the techniques introduced so far, including the above conventional technique, have a limitation that since the building is modeled considering only the environmental factors or legal elements for designing the building, it is not considered at all that the value of the building may be significantly changed depending on how the building is constructed on the site and how the building is used.

In this connection, the inventor(s) present a technique for hierarchically generating building design models on the basis of information on construction elements and information on financial elements, so that an optimum building design model is generated through hierarchical valuation.

SUMMARY OF THE INVENTION

One object of the present invention is to solve all the above-described problems in the prior art.

Another object of the invention is to hierarchically generate building design models on the basis of information on construction elements and information on financial elements, so that an optimum building design model is generated through hierarchical valuation.

Yet another object of the invention is to efficiently generate design models by extracting a part of primary design models for building design with reference to valuation scores calculated for the primary design models, and generating secondary design models on the basis of the extracted primary design models.

The representative configurations of the invention to achieve the above objects are described below.

According to one aspect of the invention, there is provided a method for designing a building model by using valuation, comprising the steps of: acquiring information on construction elements and information on financial elements regarding a building site; and hierarchically generating design models for at least one item of a building outline shape that is placeable on the building site, a building core structure that is applicable to the building outline shape, an area distribution according to a purpose of use in the building core structure, and a planar structure of each floor of the building according to the area distribution, on the basis of the acquired information, wherein in the generating step, at least one of primary design models is extracted with reference to valuation scores calculated for the primary design models, and secondary design models are generated on the basis of the at least one extracted primary design model, wherein in the generating step, the valuation scores are calculated by weighting at least one of the information on construction elements and the information on financial elements, with reference to user requirements information, wherein in the generating step, the design models are generated according to a priority of the at least one item, and wherein in the generating step, when the generated design models are modified, the design models belonging to lower classes of the modified design models are dependently regenerated.

According to another aspect of the invention, there is provided a system for designing a building model by using valuation, comprising: an information acquisition unit configured to acquire information on construction elements and information on financial elements regarding a building site; and a model generation unit configured to hierarchically generate design models for at least one item of a building outline shape that is placeable on the building site, a building core structure that is applicable to the building outline shape, an area distribution according to a purpose of use in the building core structure, and a planar structure of each floor of the building according to the area distribution, on the basis of the acquired information, wherein the design models are generated according to a priority of the at least one item, wherein the model generation unit is configured to extract at least one of primary design models with reference to valuation scores calculated for the primary design models, and to generate secondary design models on the basis of the at least one extracted primary design model, wherein the model generation unit is configured to calculate the valuation scores by weighting at least one of the information on construction elements and the information on financial elements, with reference to user requirements information, and wherein when the generated design models are modified, the model generation unit is configured to dependently regenerate the design models belonging to lower classes of the modified design models.

In addition, there are further provided other methods and systems to implement the invention, as well as non-transitory computer-readable recording media having stored thereon computer programs for executing the methods.

According to the invention, it is possible to hierarchically generate building design models on the basis of information on construction elements and information on financial elements, so that an optimum building design model is generated through hierarchical valuation.

According to the invention, it is possible to efficiently generate design models by extracting a part of primary design models for building design with reference to valuation scores calculated for the primary design models, and generating secondary design models on the basis of the extracted primary design models.

DETAILED DESCRIPTION

Figure 1:
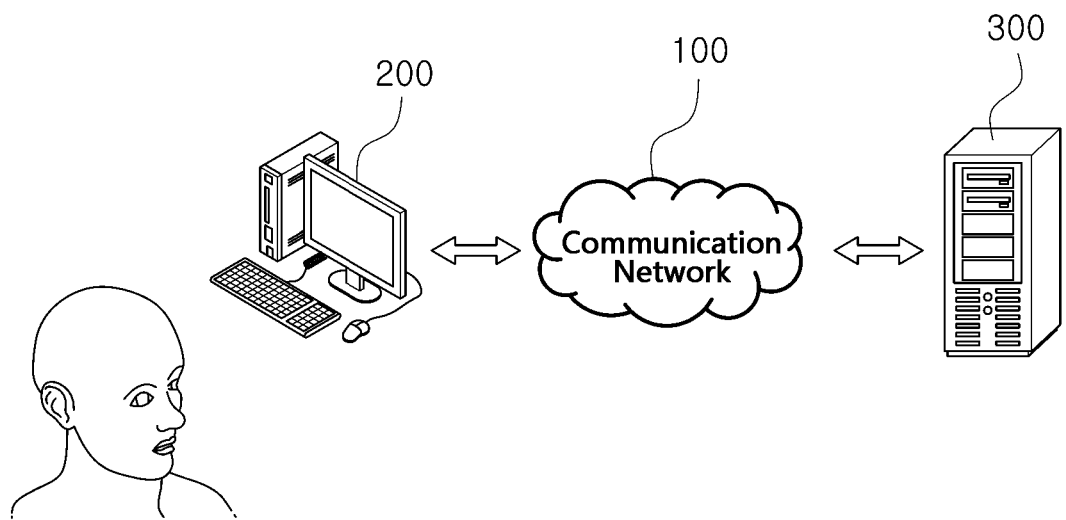
FIG. 1 schematically shows the configuration of an entire system for designing a building model according to one embodiment of the invention.

In the following detailed description of the present invention, references are made to the accompanying drawings that show, by way of illustration, specific embodiments in which the invention may be practiced. These embodiments are described in sufficient detail to enable those skilled in the art to practice the invention. It is to be understood that the various embodiments of the invention, although different from each other, are not necessarily mutually exclusive. For example, specific shapes, structures and characteristics described herein may be implemented as modified from one embodiment to another without departing from the spirit and scope of the invention. Furthermore, it shall be understood that the locations or arrangements of individual elements within each embodiment may also be modified without departing from the spirit and scope of the invention. Therefore, the following detailed description is not to be taken in a limiting sense, and the scope of the invention is to be taken as encompassing the scope of the appended claims and all equivalents thereof. In the drawings, like reference numerals refer to the same or similar elements throughout the several views.

Hereinafter, various preferred embodiments of the present invention will be described in detail with reference to the accompanying drawings to enable those skilled in the art to easily implement the invention.

Configuration of the Entire System

FIG. 1 schematically shows the configuration of an entire system for designing a building model according to one embodiment of the invention.

As shown in FIG. 1, the entire system according to one embodiment of the invention may comprise a communication network 100, a device 200, and a building model design system 300.

First, according to one embodiment of the invention, the communication network 100 may be configured regardless of communication modality such as wired and wireless communications, and may be constructed from a variety of communication networks such as local area networks (LANs), metropolitan area networks (MANs), and wide area networks (WANs). Preferably, the communication network 100 described herein may be the Internet or the World Wide Web (WWW). However, the communication network 100 is not necessarily limited thereto, and may at least partially include known wired/wireless data communication networks, known telephone networks, or known wired/wireless television communication networks.

For example, the communication network 100 may be a wireless data communication network, at least a part of which may be implemented with a conventional communication scheme such as WiFi communication, WiFi-Direct communication, Long Term Evolution (LTE) communication, Bluetooth communication (including Bluetooth Low Energy (BLE) communication), infrared communication, and ultrasonic communication. As another example, the communication network 100 may be an optical communication network, at least a part of which may be implemented with a conventional communication scheme such as Light Fidelity (LiFi).

Next, according to one embodiment of the invention, the device 200 is digital equipment that may function to connect to and then communicate with the building model design system 300 (to be described below) via the communication network 100, and any type of portable digital equipment having a memory means and a microprocessor for computing capabilities, such as a computer, a notebook PC, a smart phone, and a tablet PC, may be adopted as the device 200 according to the invention.

Meanwhile, the device 200 according to one embodiment of the invention may include an application for assisting building model design according to the invention. The application may be downloaded from an external application distribution server (not shown). Meanwhile, the characteristics of the program module may be generally similar to those of an information acquisition unit 310, a model generation unit 320, a communication unit 330, and a control unit 340 of the building model design system 300 to be described below. Here, at least a part of the application may be replaced with a hardware device or a firmware device that may perform a substantially equal or equivalent function, as necessary.

Next, the building model design system 300 according to one embodiment of the invention may function to acquire information on construction elements and information on financial elements regarding a building site, and to hierarchically generate design models for at least one item of a building outline shape that is placeable on the building site, a building core structure that is applicable to the building outline shape, an area distribution according to a purpose of use in the building core structure, and a planar structure of each floor of the building according to the area distribution, on the basis of the acquired information, wherein at least one of primary design models may be extracted with reference to valuation scores calculated for the primary design models, and secondary design models may be generated on the basis of the at least one extracted primary design model.

Further, the building model design system 300 according to one embodiment of the invention may function to provide the generated building design models to the device 200 via the communication network 100.

The configurations and functions of the building model design system 300 according to the invention will be discussed in more detail below. Meanwhile, although the building model design system 300 has been described as above, the above description is illustrative and it will be apparent to those skilled in the art that at least a part of the functions or components required for the building model design system 300 may be implemented in the device 200 or a server (not shown) or included in an external system (not shown), as necessary.

Configuration of the Building Model Design System

Hereinafter, the internal configuration of the building model design system 300 crucial for implementing the invention and the functions of the respective components thereof will be discussed.

Figure 2:
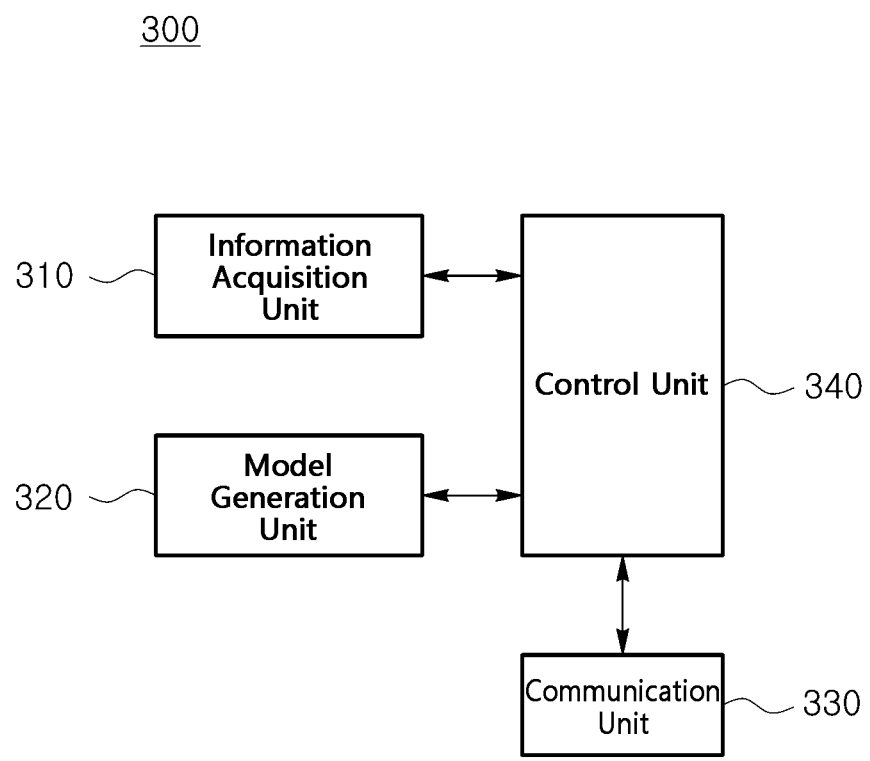
FIG. 2 illustratively shows the internal configuration of a building model design system according to one embodiment of the invention.

FIG. 2 specifically shows the internal configuration of the building model design system 300 according to one embodiment of the invention.

As shown in FIG. 2, the building model design system 300 according to one embodiment of the invention may comprise an information acquisition unit 310, a model generation unit 320, a communication unit 330, and a control unit 340. According to one embodiment of the invention, at least some of the information acquisition unit 310, the model generation unit 320, the communication unit 330, and the control unit 340 may be program modules to communicate with an external system (not shown). The program modules may be included in the building model design system 300 in the form of operating systems, application program modules, and other program modules, while they may be physically stored in a variety of commonly known storage devices. Further, the program modules may also be stored in a remote storage device that may communicate with the building model design system 300. Meanwhile, such program modules may include, but not limited to, routines, subroutines, programs, objects, components, data structures, and the like for performing specific tasks or executing specific abstract data types as will be described below in accordance with the invention.

First, according to one embodiment of the invention, the information acquisition unit 310 may function to acquire information on construction elements and information on financial elements regarding a building site.

According to one embodiment of the invention, the information on construction elements regarding the building site may include site information on the building site and a site adjacent to the building site (e.g., an area, a cadastral map, an architectural plan, a road status, a purpose of use of the site, etc.), legal information that may be applied when a building is constructed on the building site (e.g., a construction law, a parking lot law, a housing law, etc.), and environmental information on a region where the building site is located (e.g., an elevation angle of the sun by time, a view range defined by surrounding environment like buildings, climate, weather, etc.)

Further, according to one embodiment of the invention, the information on financial elements regarding the building site may include real estate market information such as information on rent fees, sale prices, or rent deposits of real estates within a predetermined distance from the building site, and an estimated sale price or rent fee of the building site, which is calculated from at least one of real transaction prices of real estates within a predetermined distance from the building site, and an average market price of real estates by city.

Further, according to one embodiment of the invention, the information acquisition unit 310 may acquire information on requirements of a user who is to construct a building on the building site, and the information on the user requirements may include information on the user's risk-taking tendency, the user's preference for use of the building (e.g., preference level for sale or lease), the user's preference level for a southern exposure or a view, and priority between utilization and amenity of the building site. The user requirements information may be acquired from the device 200 of the user, and may also be acquired on the basis of a result of the user's responses to questions/inquiries related to the building site.

Meanwhile, according to one embodiment of the invention, the information acquisition unit 310 may refer to an open API (Application Programming Interface) provision server, a known database, and the like in order to acquire the information on construction elements and the information on financial elements regarding the building site. For example, the information acquisition unit 310 may analyze data acquired from databases of various public institution websites such as the national spatial information system (available at http://nsdi.go.kr), thereby acquiring various types of information on construction, finance, sites, roads, population, real estate market prices, environment, and the like.

Next, according to one embodiment of the invention, the model generation unit 320 may function to hierarchically generate design models for at least one item of a building outline shape that is placeable on the building site, a building core structure that is applicable to the building outline shape, an area distribution according to a purpose of use in the building core structure, and a planar structure of each floor of the building according to the area distribution, on the basis of the information acquired by the information acquisition unit 310.

According to one embodiment of the invention, the building outline shape may be an outline of the building, an appearance of the building, or a location where the building is placed on the building site. The building core structure may be a main skeletal structure of the building such as an emergency stair, an elevator, an inner court, and a parking space. The area distribution according to a purpose of use may be a lease/sale area distribution of each floor. The planar structure of each floor of the building may be partitioning or placement of individual spaces of each floor.

Further, according to one embodiment of the invention, when generating the design models for the at least one item, the model generation unit 320 may hierarchically generate the design models on the basis of a predetermined priority of the at least one item. According to one embodiment of the invention, the priority may be acquired from the device 200 of the user, and may also be acquired on the basis of a result of the user's responses to questions/inquiries related to the building site.

For example, according to one embodiment of the invention, when generating the design models in the order of the building outline shape, the building core structure, the area distribution according to a purpose of use, and the planar structure of each floor of the building, the model generation unit 320 may first generate at least one design model for the building outline shape that is placeable on the building site (i.e., for the item whose priority is the highest); may generate at least one design model for the building core structure that is applicable to each of the at least one generated design model for the building outline shape (i.e., for the item whose priority is the second highest); may generate at least one design model for the area distribution according to a purpose of use that is applicable to each of the at least one generated design model for the building core structure (i.e., for the item whose priority is the third highest); and may generate at least one design model for the planar structure of each floor of the building that is applicable to each of the at least one generated design model for the area distribution according to a purpose of use (i.e., for the item whose priority is the fourth highest).

Meanwhile, according to one embodiment of the invention, the model generation unit 320 may use a metaheuristic algorithm in order to generate the design models for at least one item of the building outline shape placeable on the building site, the building core structure applicable to the building outline shape, the area distribution according to a purpose of use in the building core structure, and the planar structure of each floor of the building according to the area distribution. The metaheuristic algorithm may include at least one of a genetic algorithm (GA), a simulated annealing (SA) algorithm, and a tabu search (TS) algorithm.

Further, according to one embodiment of the invention, when hierarchically generating the design models for the at least one item, the model generation unit 320 may extract at least one of primary design models with reference to valuation scores calculated for the primary design models, and may generate secondary design models on the basis of the at least one extracted primary design model.

Specifically, according to one embodiment of the invention, the model generation unit 320 may extract at least one of design models generated for a specific item (i.e., primary design models), with reference to valuation scores calculated for the primary design models, in a predetermined number or by a predetermined criterion (e.g., models whose valuation scores are within the top 10% among the models for the specific item), and may generate upper or lower class design models (i.e., secondary design models) for the at least one extracted primary design model.

According to one embodiment of the invention, the model generation unit 320 may calculate the valuation scores on the basis of at least one of the information on construction elements and the information on financial elements.

For example, according to one embodiment of the invention, the model generation unit 320 may calculate a valuation score for at least one item, e.g., for the building outline shape that is placeable on the building site, on the basis of at least one of a gross floor area of the building, rectangularity of the building shape, and annual average solar irradiance of the building. In this case, according to one embodiment of the invention, the model generation unit 320 may calculate the valuation score for the building outline shape by increasing the valuation score when the gross floor area of the building or the annual average solar irradiance on the building surface is increased, and decreasing the valuation score when the building is not in a rectangular shape (whose degree of space utilization is high) but in another shape (e.g., a rhombic shape, a parallelogrammic shape, a triangular shape, or the like). Meanwhile, according to one embodiment of the invention, the model generation unit 320 may also calculate the valuation score by weighting at least one of the gross floor area of the building, the rectangularity of the building shape, and the annual average solar irradiance of the building, with reference to the user requirements information. Further, according to one embodiment of the invention, the model generation unit 320 may extract at least one design model for the building outline shape (i.e., primary design model), with reference to the calculated valuation score for the building outline shape, in a predetermined number or by a predetermined criterion, and may generate upper or lower class design models (i.e., secondary design models) (e.g., in this case, design models for at least one item of the building core structure, the area distribution according to a purpose of use, and the planar structure of each floor of the building) for the at least one extracted design model for the building outline shape.

As another example, according to one embodiment of the invention, the model generation unit 320 may calculate a valuation score for at least one item, e.g., for the building core structure that is applicable to the building outline shape, on the basis of an index of legal use change flexibility or an index of structural change flexibility of the building. According to one embodiment of the invention, the index of legal use change flexibility of the building may indicate how flexibly the legal purpose of use of the building may be changed in the future (which may be calculated on the basis of the number of vehicles that are parkable in the building, for example), and the index of structural change flexibility of the building may indicate how flexibly the inner spatial structure of the building may be changed in the future (which may be calculated on the basis of the number of bearing walls and the spacing between the bearing walls, for example). In this case, according to one embodiment of the invention, the model generation unit 320 may calculate the valuation score for the building core structure by increasing the valuation score when the number of parkable vehicles or the spacing between the bearing walls is large. Meanwhile, according to one embodiment of the invention, the model generation unit 320 may also calculate the valuation score by weighting at least one of the index of legal use change flexibility and the index of structural change flexibility of the building, with reference to the user requirements information. Further, according to one embodiment of the invention, the model generation unit 320 may extract at least one design model for the building core structure (i.e., primary design model), with reference to the calculated valuation score for the building core structure, in a predetermined number or by a predetermined criterion, and may generate upper or lower class design models (i.e., secondary design models) (e.g., in this case, design models for at least one item of the building outline shape, the area distribution according to a purpose of use, and the planar structure of each floor of the building) for the at least one extracted design model for the building core structure.

As yet another example, according to one embodiment of the invention, the model generation unit 320 may calculate a valuation score for at least one item, e.g., for the area distribution according to a purpose of use in the building core structure, on the basis of at least one of the user's risk-taking tendency, the user's preference level for use of the building, and a real estate discount rate. According to one embodiment of the invention, the user's risk-taking tendency may indicate the user's tendency to desire stable income or to desire aggressive investment through the building (which may be expressed as, for example, a value between a negative number and 0, in which case a negative number may indicate that the user does not want the risk taking, and 0 may indicate that the user accepts the risk taking.) The user's preference level for use of the building may indicate the user's preference level for sale or lease (which may be expressed as, for example, a value between 0 and 1, in which case 1 may indicate that the user only considers lease operation, and 0 may indicate that the user does not consider lease operation at all.) The real estate discount rate may be a constant for estimating an asset value of the building by discounting annual rental income of the building. In this case, according to one embodiment of the invention, the model generation unit 320 may calculate the valuation score for the area distribution according to a purpose of use by increasing a sale ratio of the building when the user's stable tendency is strong and increasing a lease ratio of the building when the user's aggressive tendency is strong, or by increasing the valuation score as the real estate discount rate is smaller, with reference to the user requirements information. Meanwhile, according to one embodiment of the invention, the model generation unit 320 may also calculate the valuation score by weighting at least one of the user's risk-taking tendency, the user's preference level for use of the building, and the real estate discount rate, with reference to the user requirements information. Further, according to one embodiment of the invention, the model generation unit 320 may extract at least one design model for the area distribution according to a purpose of use (i.e., primary design model), with reference to the calculated valuation score for the area distribution according to a purpose of use, in a predetermined number or by a predetermined criterion, and may generate upper or lower class design models (i.e., secondary design models) (e.g., in this case, design models for at least one item of the building outline shape, the building core structure, and the planar structure of each floor of the building) for the at least one extracted design model for the area distribution according to a purpose of use.

As still another example, according to one embodiment of the invention, the model generation unit 320 may calculate a valuation score for at least one item, e.g., for the planar structure of each floor of the building according to the area distribution, on the basis of at least one of a ratio of an area for exclusive use to a total area of each floor, an amount of daylighting, and a view range. According to one embodiment of the invention, the amount of daylighting may be calculated by calculating the time and energy of sunlight coming through a window for one year according to an elevation angle of the sun over time, with respect to each separate space in the building. The view range may be calculated by dividing a window of a separate space in the building into a grid with a predetermined increment (e.g., 30 cm) and summing a distance that a straight line projected from each point at a right angle to the building surface may reach. In this case, according to one embodiment of the invention, the model generation unit 320 may calculate the valuation score for the planar structure of each floor of the building by increasing the valuation score as the ratio of the area for exclusive use to the total area of each floor is larger, the amount of daylighting for each separate space is larger, or the view range for each separate space is wider. Meanwhile, according to one embodiment of the invention, the model generation unit 320 may also calculate the valuation score by weighting at least one of the ratio of the area for exclusive use to the total area of each floor, the amount of daylighting, and the view range, with reference to the user requirements information. Further, according to one embodiment of the invention, the model generation unit 320 may extract at least one design model for the planar structure of each floor (i.e., primary design model), with reference to the calculated valuation score for the planar structure of each floor, in a predetermined number or by a predetermined criterion, and may generate upper or lower class design models (i.e., secondary design models) (e.g., in this case, design models for at least one item of the building outline shape, the building core structure, and the area distribution according to a purpose of use) for the at least one extracted design model for the planar structure of each floor.

Meanwhile, according to one embodiment of the invention, when the generated design models are modified, the model generation unit 320 may dependently regenerate the design models belonging to lower classes of the modified design models.

For example, according to one embodiment of the invention, it may be assumed that the at least one item for model generation is prioritized in the order of the building outline shape, the building core structure, the area distribution according to a purpose of use, and the planar structure of each floor of the building. When a location of a stair hall in a specific design model for the building core structure is partly changed, the model generation unit 320 may dependently regenerate the design models belonging to lower classes of the design models for the building core structure including the specific design model (in this case, the design models for at least one item of the area distribution according to a purpose of use and the planar structure of each floor of the building).

Next, the communication unit 330 according to one embodiment of the invention may function to enable data transmission/reception from/to the information acquisition unit 310 and the model generation unit 320.

Lastly, the control unit 340 according to one embodiment of the invention may function to control data flow among the information acquisition unit 310, the model generation unit 320, and the communication unit 330. That is, the control unit 340 according to the invention may control data flow into/out of the building model design system 300 or data flow among the respective components of the building model design system 300, such that the information acquisition unit 310, the model generation unit 320, and the communication unit 330 may carry out their particular functions, respectively.

Figure 3:
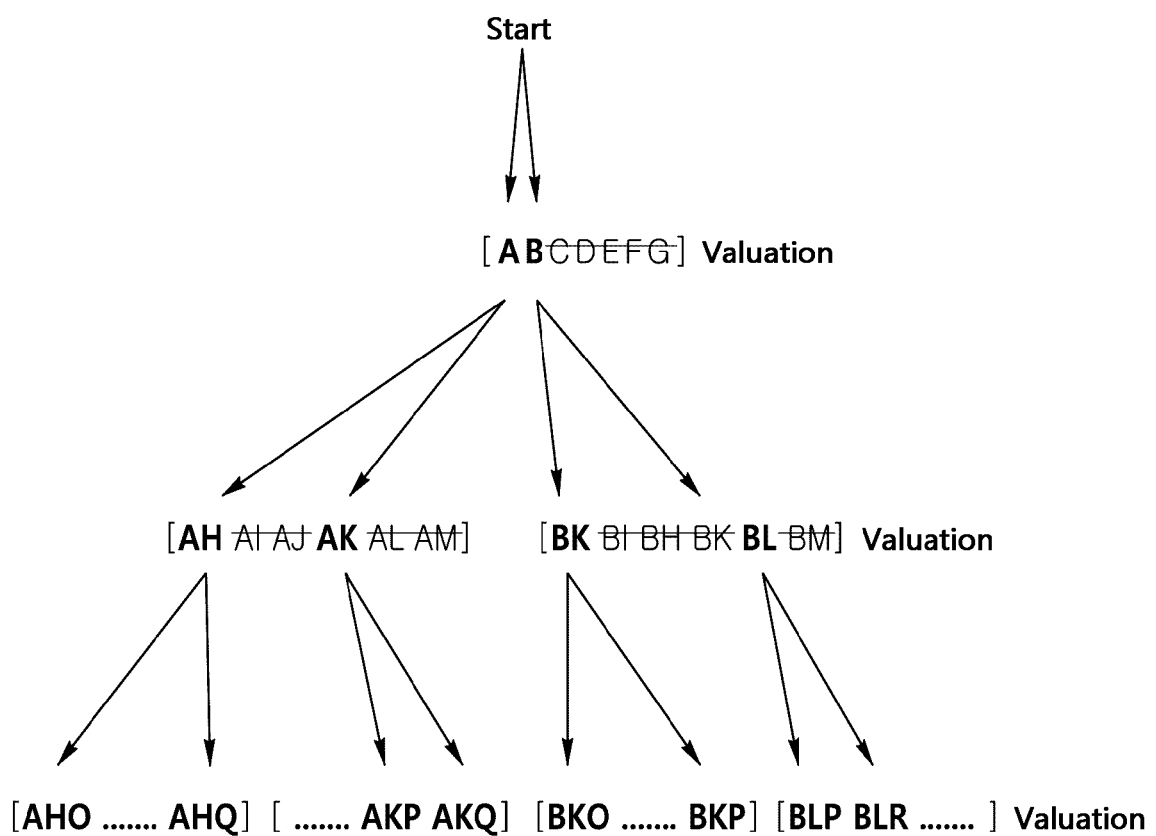
FIG. 3 schematically shows an algorithm for hierarchically generating building models through a building model design system according to one embodiment of the invention.

FIG. 3 schematically shows an algorithm for hierarchically generating building models through the building model design system 300 according to one embodiment of the invention.

According to one embodiment of the invention, among design models for a building outline shape that is placeable on a building site for which a building is to be designed (hereinafter, "Item 1"), a building core structure that is applicable to the building outline shape (hereinafter, "Item 2"), an area distribution according to a purpose of use in the building core structure (hereinafter, "Item 3"), and a planar structure of each floor of the building according to the area distribution (hereinafter, "Item 4"), the building model design system 300 may choose to generate design models for the building core structure applicable to the building outline shape (i.e., Item 2), the area distribution according to a purpose of use in the building core structure (i.e., Item 3), and the planar structure of each floor of the building according to the area distribution (i.e., Item 4), on the basis of information acquired from the device 200 of a user (e.g., information on the building site and user requirements information). According to model generation priorities of the above items, design models A, B, C, D, E and F for the building core structure applicable to the building outline shape (i.e., Item 2) are first generated, and valuation scores for the generated models are calculated on the basis of the number of parkable vehicles. The top two design models A and B are extracted among the design models A, B, C, D, E and F for the building core structure (i.e., Item 2) with reference to the calculated valuation scores, and design models AH, AI, AJ, AK, AL, AM, BK, BI, BH, BK, BL and BM for the area distribution according to a purpose of use in the building core structure (i.e., Item 3) may be generated in a lower class of the extracted design models A and B for the building core structure. According to one embodiment of the invention, the building model design system 300 may calculate valuation scores for the generated design models for the area distribution according to a purpose of use (i.e., Item 3) on the basis of the user's risk-taking tendency and preference level for use of the building, and extract the top two design models AH, AK, BK, and BL among the design models AH, AI, AJ, AK, AL, AM, BK, BI, BH, BK, BL and BM for the area distribution according to a purpose of use (i.e., Item 3) with reference to the calculated valuation scores, and may generate design models (i.e., 24 design models including AHO, AHQ, AKP, AKQ, BKO, BKP, BLP and BLR) for the planar structure of each floor of the building according to the area distribution (i.e., Item 4) in a lower class of the extracted design models AH, AK, BK and BL for the area distribution according to a purpose of use. According to one embodiment of the invention, the building model design system 300 may calculate valuation scores for the generated design models for the planar structure of each floor of the building according to the area distribution (i.e., Item 4) on the basis of an amount of daylighting and a view range, and extract the top two design models AHO, AHQ, AKP, AKQ, BKO, BKP, BLP and BLR among the design models (i.e., 24 design models including AHO, AHQ, AKP, AKQ, BKO, BKP, BLP and BLR) for the planar structure of each floor of the building according to the area distribution (i.e., Item 4) with reference to the calculated valuation scores, thereby designing building models AHO, AHQ, AKP, AKQ, BKO, BKP, BLP and BLR to be provided to the user.

Meanwhile, according to one embodiment of the invention, when calculating the valuation scores, the building model design system 300 may weight the valuation scores for the user's risk-taking tendency and the amount of daylighting in comparison with the valuation scores for the user's preference level for use of the building and the view range, with reference to the user requirements information.

Figure 4:
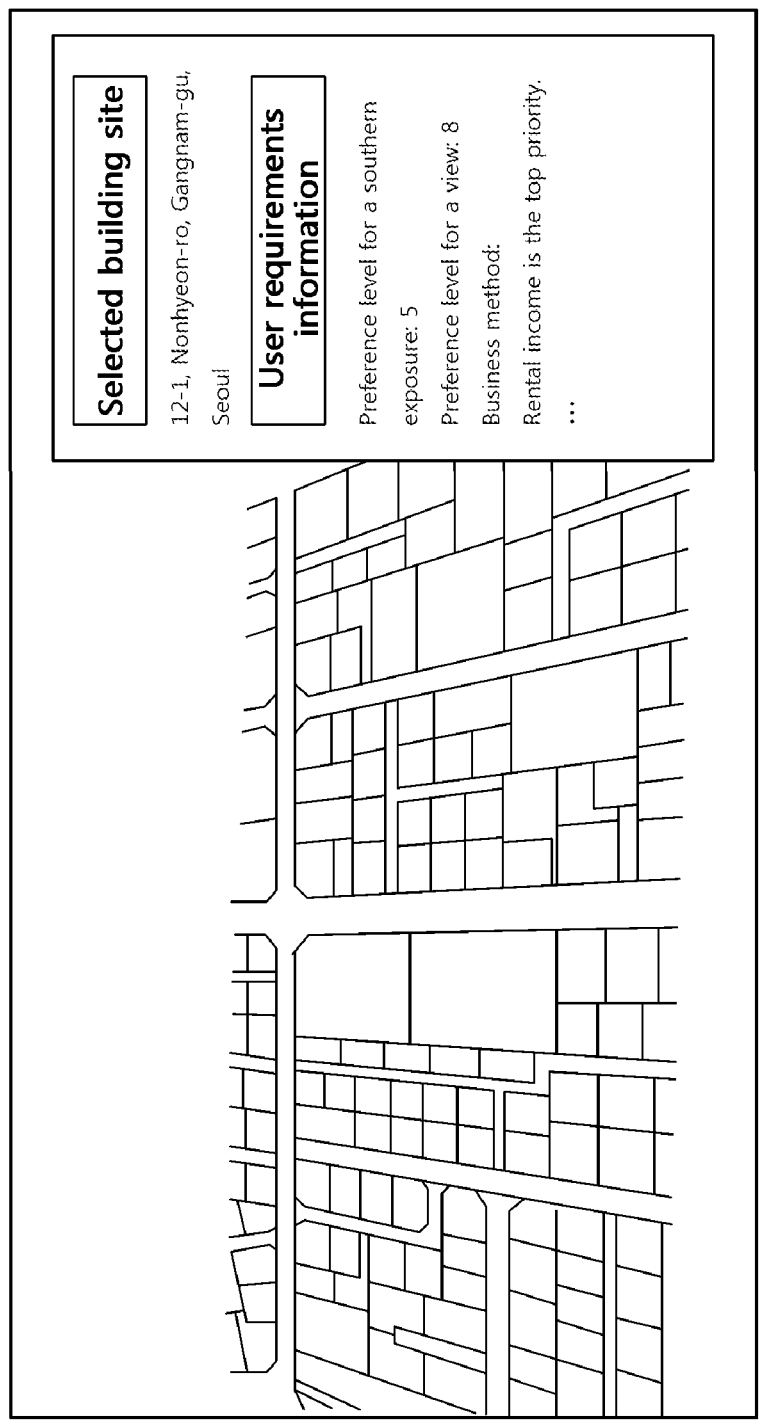
FIGS. 4 to 6 illustratively show screens provided to a user through a building model design system according to one embodiment of the invention.
Figure 5:
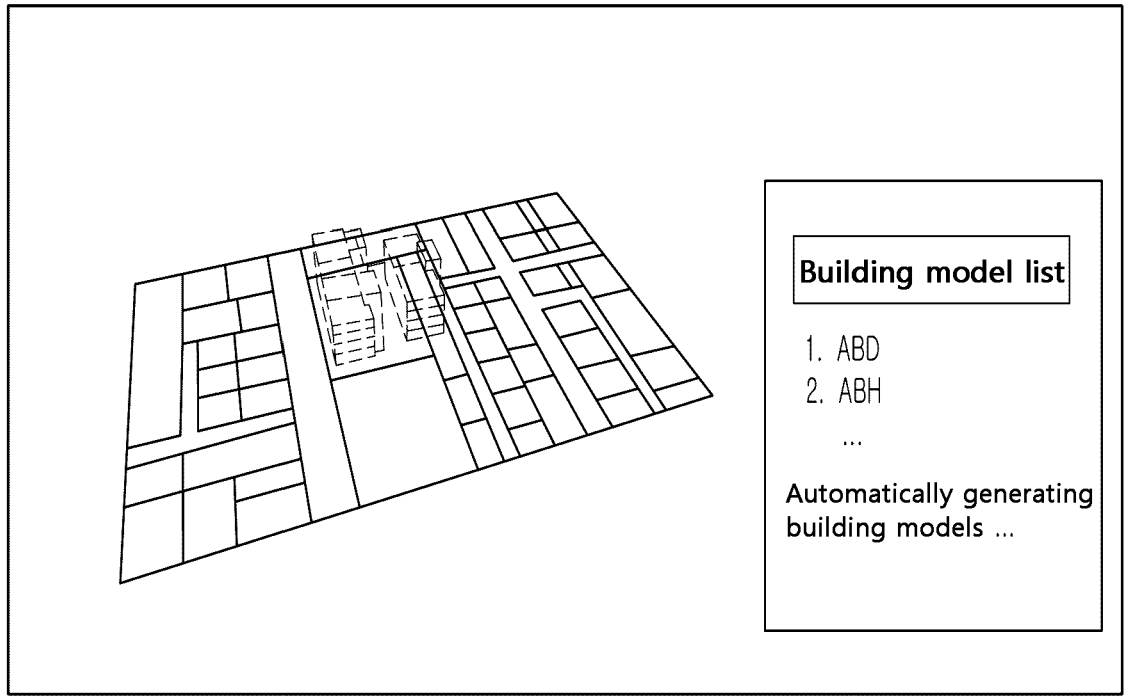
Figure 6:
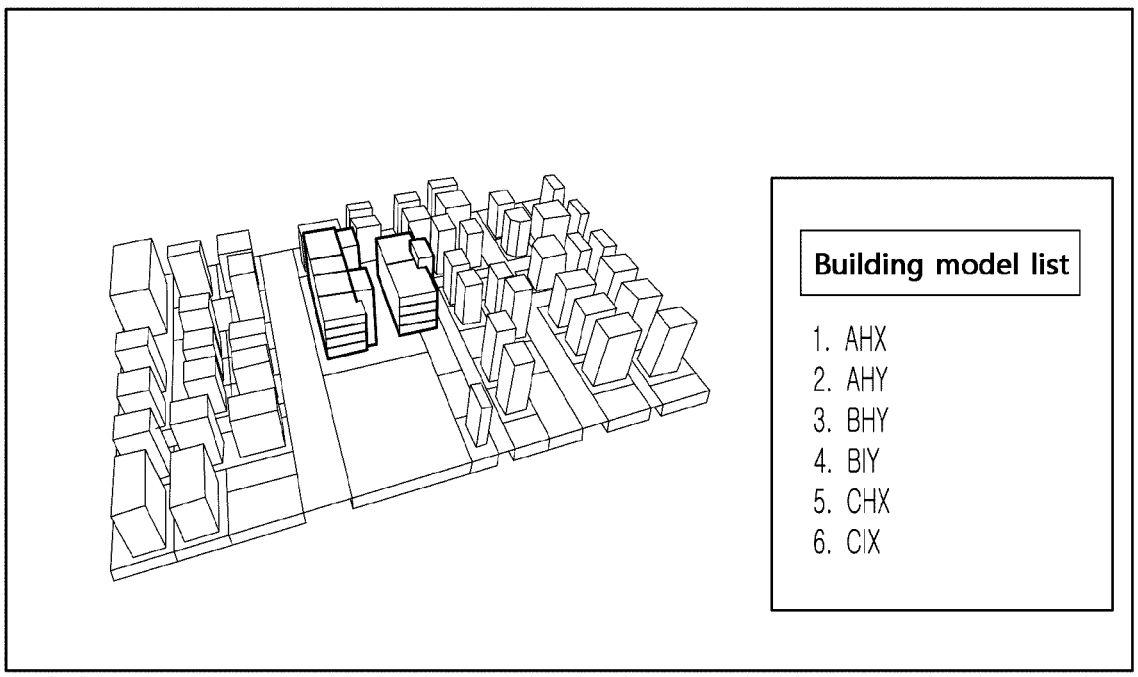

FIGS. 4 to 6 illustratively show screens provided to a user through the building model design system 300 according to one embodiment of the invention.

As shown in FIG. 4 according to one embodiment of the invention, a user A may determine a building site for which a building is to be designed (in this case, "12-1, Nonhyeon-ro, Gangnam-gu, Seoul") on a map, and enter user requirements information (in this case, "Preference level for a southern exposure: 5"; "Preference level for a view: 8"; and "Business method: Rental income is the top priority."), through the device 200 of the user.

Next, as shown in FIG. 5 according to one embodiment of the invention, the building model design system 300 may hierarchically and automatically generate design models (e.g., ABD, ABH, etc.) for at least one item of a building outline shape that is placeable on the building site, a building core structure that is applicable to the building outline shape, an area distribution according to a purpose of use in the building core structure, and a planar structure of each floor of the building according to the area distribution, on the basis of the information acquired from the device 200 of the user.

Next, as shown in FIG. 6 according to one embodiment of the invention, the building model design system 300 may visualize some of the generated design models (i.e., AHX, AHY, BHY, BIY, CHX, and CIX) and provide them to the device 200 of the user. According to one embodiment of the invention, when modifications are requested for some of the generated design models by the device 200 of the user, the building model design system 300 may dependently regenerate the design models belonging to lower classes of the design models for which the modifications are requested, and provide them to the device 200 of the user.

Meanwhile, according to one embodiment of the invention, when providing the generated building design models to the user, the building model design system 300 may preferentially provide the design models with high valuation scores to the user.

The embodiments according to the invention as described above may be implemented in the form of program instructions that can be executed by various computer components, and may be stored on a computer-readable recording medium. The computer-readable recording medium may include program instructions, data files, data structures and the like, separately or in combination. The program instructions stored on the computer-readable recording medium may be specially designed and configured for the present invention, or may also be known and available to those skilled in the computer software field. Examples of the computer-readable recording medium include the following: magnetic media such as hard disks, floppy disks and magnetic tapes; optical media such as compact disk-read only memory (CD-ROM) and digital versatile disks (DVDs); magneto-optical media such as floptical disks; and hardware devices such as read-only memory (ROM), random access memory (RAM) and flash memory, which are specially configured to store and execute program instructions. Examples of the program instructions include not only machine language codes created by a compiler or the like, but also high-level language codes that can be executed by a computer using an interpreter or the like. The above hardware devices may be configured to operate as one or more software modules to perform the processes of the present invention, and vice versa.

Although the present invention has been described above in terms of specific items such as detailed elements as well as the limited embodiments and the drawings, they are only provided to help more general understanding of the invention, and the present invention is not limited to the above embodiments. It will be appreciated by those skilled in the art to which the present invention pertains that various modifications and changes may be made from the above description.

Therefore, the spirit of the present invention shall not be limited to the above-described embodiments, and the entire scope of the appended claims and their equivalents will fall within the scope and spirit of the invention.

What is claimed is:

1. A method performed in a system for designing a building model of a building by using valuation, the system comprising a non-transitory computer-readable media storing instructions, and the method comprising the steps of:

acquiring information on construction elements and information on financial elements regarding a building site; and hierarchically generating initial design models for at least one item of a building outline shape that is placeable on the building site, a building core structure that is applicable to the building outline shape, an area distribution according to a purpose of use in the building core structure, and a planar structure of each floor of the building according to the area distribution, on the basis of the acquired information, wherein in the generating step, at least one of primary design models is extracted among the initial design models with reference to valuation scores calculated for the primary design models, and secondary design models are generated on the basis of the at least one extracted primary design model, wherein in the generating step, the valuation scores are calculated by weighting at least one of the information on construction elements and the information on financial elements, with reference to user requirements information, wherein in the generating step, the initial design models are generated according to a priority of the at least one item, wherein in the generating step, when the generated initial design models are modified, the primary design models, the secondary design models, or both belonging to lower classes of the modified initial design models are dependently regenerated, wherein in the generating step, a valuation score for the planar structure of each floor of the building according to the area distribution, among the at least one item, is calculated on the basis of a view range, and wherein in the generating step, the view range is calculated by dividing a window of a separate space in the building into a grid with a predetermined increment and summing distances that straight lines projected from each point of the grid at a right angle to the building surface may reach.

2. The method of claim 1, wherein the valuation scores are calculated on the basis of at least one of a gross floor area of the building, solar irradiance of the building, a number of vehicles that are parkable in the building, atypical space penalty, and the user requirements information.

3. The method of claim 1, wherein in the generating step, a valuation score for the building outline shape that is placeable on the building site, among the at least one item, is calculated on the basis of at least one of a gross floor area of the building, rectangularity of the building outline shape, and annual average solar irradiance of the building.

4. The method of claim 1, wherein in the generating step, a valuation score for the building core structure that is applicable to the building outline shape, among the at least one item, is calculated on the basis of at least one of a number of vehicles that are parkable in the building, a number of bearing walls, and spacing between the bearing walls.

5. The method of claim 1, wherein in the generating step, a valuation score for the area distribution according to a purpose of use in the building core structure, among the at least one item, is calculated on the basis of at least one of the user's risk-taking tendency, the user's preference level for use of the building, and a real estate discount rate.

6. The method of claim 1, wherein in the generating step, the valuation score for the planar structure of each floor of the building according to the area distribution, among the at least one item, is calculated further on the basis of at least one of a ratio of an area for exclusive use to a total area of each floor, and an amount of daylighting.

7. The method of claim 1, wherein in the generating step, the initial design models are generated on the basis of at least one of a genetic algorithm (GA), a simulated annealing (SA) algorithm, and a tabu search (TS) algorithm.

8. A non-transitory computer-readable recording medium having stored thereon a computer program for executing the method of claim 1.

9. A system for designing a building model of a building by using valuation, comprising:

a non-transitory computer-readable media storing instructions that, when executed by a processor, cause the system to:

acquire information on construction elements and information on financial elements regarding a building site; and hierarchically generate initial design models for at least one item of a building outline shape that is placeable on the building site, a building core structure that is applicable to the building outline shape, an area distribution according to a purpose of use in the building core structure, and a planar structure of each floor of the building according to the area distribution, on the basis of the acquired information, wherein the initial design models are generated according to a priority of the at least one item, wherein the instructions, when executed by the processor, cause the system to:

extract at least one of primary design models among the initial design models with reference to valuation scores calculated for the primary design models, and to generate secondary design models on the basis of the at least one extracted primary design model, calculate the valuation scores by weighting at least one of the information on construction elements and the information on financial elements, with reference to user requirements information, when the generated initial design models are modified, dependently regenerate the primary design models, the secondary design models, or both belonging to lower classes of the modified initial design models, calculate a valuation score for the planar structure of each floor of the building according to the area distribution, among the at least one item, on the basis of a view range, and calculate the view range by dividing a window of a separate space in the building into a grid with a predetermined increment and summing distances that straight lines projected from each point of the grid at a right angle to the building surface may reach.

* * * * *